United States Patent [19]

Schumacher

[11] Patent Number: 4,891,201
[45] Date of Patent: Jan. 2, 1990

[54] ULTRA-PURE EPITAXIAL SILICON

[75] Inventor: John C. Schumacher, Carlsbad, Calif.

[73] Assignee: Diamond Cubic Liquidation Trust, Oceanside, Calif.

[21] Appl. No.: 648,339

[22] Filed: Sep. 6, 1984

Related U.S. Application Data

[63] Continuation of Ser. No. 397,445, Jul. 12, 1982, abandoned.

[51] Int. Cl.$^4$ ............................................. C01B 33/02
[52] U.S. Cl. .................................... 423/348; 423/349; 156/613; 437/81; 148/33.0
[58] Field of Search ................................ 423/348–350; 156/613, DIG. 614; 427/86

[56] References Cited

U.S. PATENT DOCUMENTS 2,938,772  5/1960  Enk et al. ............................ 423/349
4,084,024  4/1978  Schumacher ................... 423/342 X
4,279,688  7/1981  Abrahams et al. .................. 423/349

FOREIGN PATENT DOCUMENTS 878764  10/1961  United Kingdom ................ 423/349

OTHER PUBLICATIONS

*Silicon Semiconductor Technology* by W. R. Runyan (1965) McGraw-Hill p. 65.

Primary Examiner—William R. Dixon, Jr.
Assistant Examiner—Deborah Jones
Attorney, Agent, or Firm—Grant L. Hubbard

[57] ABSTRACT

Production of epitaxial silicon by thermal decomposition or hydrogen reduction of bromosilanes or iodosilane is disclosed.

4 Claims, No Drawings

ULTRA-PURE EPITAXIAL SILICON

This application is a continuation, of application Ser. No 397,445, filed July 12, 1982, now abandoned.

TECHNICAL FIELD

This invention relates to silicon, and specifically to semiconductor grade silicon, and to methods of preparing the same.

BACKGROUND

Silicon, as an element, is widely used as a semiconductor material. Semiconductor grade silicon is of extremely high purity and even the most minor impurities can have very dramatic effects upon the semiconductive characteristics of the material and upon potential uses of such silicon. The electrical properties of silicon semiconductor devices are in large part determined by minute amounts of preselected impurities introduced in predetermined amounts into prelocated portions of a semiconductor device.

Epitaxial silicon offers the device engineer homogeneously doped single crystal layers with steep concentration gradients between the layers. Epitaxial films are grown in a variety of thicknesses

| | |
|---|---|
| Thin | 0.5–3 microns |
| Medium | 3–10 microns |
| Thick | 10–20 microns |
| Very thick | >20 microns |
| and doping levels | |
| Very heavily doped | 0.005–0.1 ohm-cm |
| Heavily doped | 0.1–0.3 ohm-cm |
| Moderately doped | 0.3–1 ohm-cm |
| Lightly doped | 1–10 ohm-cm |

Process difficulty increases considerably at the extreme values of both thickness and resistivity; n-type epitaxy production exceeds p-type by a wide margin.

Device applications include power, small signal discrete, bipolar memory, linear, microwave, imaging, and certain MOS devices. ("Semiconductor Silicon" 1973, ECS Softbound Series, New York 1973.)

The critical parameters for epitaxial film include thickness and resistivity, auto-doping and out-diffusion, crystallographic defects, buried layer pattern shift/washout, morphological defects. These parameters are controlled by:

| | |
|---|---|
| Reactor Geometry | Buried Layer preparation technique |
| Reactor Pressure | |
| Method of Heating | Growth Rate |
| Substrate Orientation | Growth Temperature |
| Substrate Crystal perfection | Main Gas Purity |
| | Growth Chemicals |

Both silicon homo-epitaxy and silicon heteroepitaxy are recognized as well as other epitaxial films.

At atmospheric pressure, epitaxial silicon is grown in a hydrogen atmosphere from four chemicals as noted in Table I.

TABLE I

| | Epitaxial Growth of Silicon in Hydrogen Atmosphere | | |
|---|---|---|---|
| Chemical Deposition | Normal Growth Rate | Temperature Range | Allowed Oxide Level |
| $SiCl_4$ | 0.4–1.5 u/min | 1150–1250° C. | 5–10 ppm |

TABLE I-continued

| | Epitaxial Growth of Silicon in Hydrogen Atmosphere | | |
|---|---|---|---|
| Chemical Deposition | Normal Growth Rate | Temperature Range | Allowed Oxide Level |
| $SiHCl_3$ | 0.4–2.0 | 1100–1200° C. | 5–10 ppm |
| $SiH_2Cl_2$ | 0.4–3.0 | 1050–1150° C. | <5 ppm |
| $SiH_4$ | 0.2–0.3 | 950–1050° C. | <2 ppm |

The thermodynamics of the $H_2$-Si-Cl system are well characterized. Other silicon halide systems have been studied (E. A. Taft, *J. Electrochem. Soc.*, vol. 118, p. 1535, 1971; L. P. Hunt and E. Sirtl, Abs. No. 270, pp. 672–673, Extended Abstracts, 72-2, Electrochem. Soc., New York, 1972; T. Suzuki, M. Ura, T. Ogawa, pp. 191–200, *Proc. Conf. Chem. Vap. Dep., Second Conf.*, J. Block & J. C. Withers, Eds., ECS Softboud Series, New York 1972); however, chlorine chemistry is most widely used. HCl impurities have been reported to affect device properties and there are reports of significant reduction of impurities when bromine-based chemicals are used (L. V. Gregor, T. Balik, F. J. Campagna, *IBM J. Res. and Dev.*, vol. 9, p. 327, 1965); however, these benefits have not been realized for most devices in production today.

Epitaxy can be defined as the regularly oriented growth of one crystalline substance on another. The growing crystalline substance is called an "epitaxial film", while the substance upon which the growth occurs is known as the "substrate". If the epitaxial film and the substrate are substances of the same kind, one deals with homoepitaxy, if not, heteroepitaxy. In addition, an epitaxial film can be grown with material supplied from a liquid phase or vapor phase in contact with the substrate. Thus, growth across a solid-liquid interface occurs in liquid-phase epitaxy, while a solid-vapor interface is employed in vapor phase epitaxial growth.

Currently employed commercial processes for vapor phase growth of silicon films are shown in Table II.

TABLE II

| | Commercial Processes | |
|---|---|---|
| Source Materials | Deposition Temperature | Film |
| $SiCl_4$, $H_2$ | 1200° C. | Epi |
| $SiHCl_3$, $H_2$ | 1150° C. | Epi |
| $SiCl_2H_2$, $H_2$ | 1100° C. | Epi |
| $SiH_4$, $H_2$ | 1050° C. | Epi |
| $SiH_4$, He | 900° C. | Epi |
| $SiHCl_3$, $H_2$ | 900–1000° C. | Poly |
| $SiH_4$ | 600–700° C. (low pressure) | Poly |

SUMMARY OF THE INVENTION

The present invention is concerned with vapor phase epitaxial silicon growth, and is primarily directed at homoepitaxy, although the same principles would apply to heteroepitaxy, In addition, the halosilane compounds, $SiBr_4$, $SiHBr_3$, $SiI_4$ and $SiHI_3$ are used for the purposes of the present invention, as silicon sources in vapor phase growth of epitaxial silicon films due to their unique chemical, physical, thermodynamic, and kinetic properties, as described below.

This invention may be characterized as an improved process for producing epitaxial silicon, which operates at a lower temperature and produces higher quality films than do conventional processes at economically useful production rates. The invention is also characterized in that the starting materials are bromosilanes or iodosilanes, rather than chlorosilanes. Process temperature ranges are from about 800° C. to 1,200° C.

The invention may be further characterized in that, in principle, it can be operated without any diluent, whereas a diluent such as H₂ or He is *required* in prior art processes. Even if one chose to use a diluent, less diluent would be used than in the prior art chlorosilane processes at corresponding conditions of temperature and growth rate.

Higher quality films also characterize this invention. Up to two orders of magnitude higher resistivity are obtained using this process, with resistivities of up to 25,000 ohm-cm being achieved.

An exemplary embodiment of the invention may be described in terms of starting with HSiBr₃, decomposing the HSiBr₃ according to the formula given herein at a temperature of about 1050° C. in a ratio of 100:1 H₂ to HSiBr₃, at a growth rate of 200–500 A°/minute, to produce epitaxial films of 20,000 to 25,000 ohm-cm resistivity. It is emphasized that the foregoing merely exemplifies and does not limit the invention.

DESCRIPTION OF THE BEST MODE

In order to describe the invention at hand, a short description of the physics of chemical vapor deposition is presented which will explain the change of film character from epitaxial to polycrystalline as deposition temperature is lowered with identical source material, as shown in Table II. Chemical vapor deposition (CVD) processes involve a chemical reaction rather than a simple condensation as in physical vapor deposition. For this reason, a necessary but not sufficient condition for initiations of the deposition process is that the Gibbs Free Energy ($\Delta G$) be negative for the reaction in question at the temperature and pressure utilized in the process. That is to say, for the chemical reaction $$SiCl_4 + 2H_2 \rightarrow Si + 4HCl$$

$$\Delta G = \Delta H - T\Delta S \leq 0 \text{ at } 1200° C.$$

from the process listing presented above. The Gibbs Free Energy represents work which can be obtained from the system if and when the chemical reaction takes place. However, for the reaction to take place, work must be done by the system to create the surface of the new phase (the silicon in the above equation). The total system free energy change can thus only be negative (a precondition to system change) if the work obtained from the chemical reaction is greater than the work done to create the surface of the new phase.

Free Energy is a function of the number of entities contained in a system. Thus, $$G = \Sigma g_i$$

and $$\Delta G = \Sigma \Delta g_i$$

so that when each molecule of SiCl₄ is converted to Si and HCl, a specific quantity, $\Delta g$ of work is made available to the system. However, when a silicon phase is formed, work must be expended to create its surface. This can either be in the form of a spherical surface for homogeneous nucliation of the new phase in the vapor—a sphere has the minimum surface to volume ratio of all shapes of identical volume and therefore requires the minimum work expenditure on creation, or in the form of a surface disk in the case of heterogeneous nucliation of the new phase on a substrate. The following condition is required for homogeneous nucliation to take place:

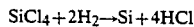

That is to say that since the surface to volume ratio of a sphere decreases as radius increases, a sufficient number of molecules must combine by random fluctuations so that if the change were to occur, more work would be obtained from the chemical change than it would take to create the spherical surface of the new phase. In the case of heterogeneous nucliation the work required for creation of a new surface can be decreased by chemical interaction between the substrate and the atoms of the film grown upon it.

The physical process of random fluctuation gathering of a critical nucleus where $$\sum_{1}^{n} \Delta g_i > A(r)g(A)$$

is one in which atoms are adsorbed on the surface (adatoms), diffuse along the surface, and then are reevaporated. If a sufficient number of atoms are agglomerated during the surface diffusion process prior to reevaporation, a critical nuclius can be formed and growth can be initiated. Furthermore, if surface diffusion is rapid, the adatom has a higher probability of interacting with a growing nucleus than when surface diffusion rates are low.

Surface diffusion rates are directly dependent upon temperature. Thus, at high temperatures epitaxial growth from a single critical nucleus can occur. As the surface temperature is lowered, however, many nuclei are required for growth and polycrystalline growth takes place. At still lower temperatures so many nuclei occur that no regular crystal array is established, and an amorphous film results. This trend can be seen in Table II.

The halosilane silicon source materials utilized in the practice of the invention described herein, namely SiBr₄, SiHBr₃, SiI₄, and SiHI₃ possess the unique characteristic compared to the source materials employed in conventional commercial processes described in the table presented above, of a low propensity for homogeneous nucliation. This fact is demonstrated by U.S. Pat. No. 4,318,942 in which bromosilanes are able to be utilized essentially undiluted in the thermal decomposition reaction

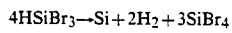

to produce semiconductor grade polycrystalline silicon, whereas chlorosilane and silicon based process require 20:1 dilution with hydrogen to suppress homogeneous nucliation. A side effect of the use of hydrogen dilution is that some fraction of the silicon produced occurs via the reaction

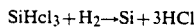

which is a higher temperature reaction ($\Delta G(t) < 0$ at a higher temperature). Thus, hydrogen is added to suppress homogeneous nucleation and results in an increase in reaction temperature. This can also be seen in the commercial process described (Table II) above where epitaxial silicon can be grown from SiH4 at 900° C. in helium but requires 1050° C. in hydrogen.

The invention described herein utilizes the named halosilanes to produce at low temperature (relative), an epitaxial film of silicon via the reactions $$SiX_4 + 2H_2 \rightarrow Si + 4HX$$

or $$SiHX_3 + H_2 \rightarrow Si + 3HX$$

or $$SiX_4 \rightarrow Si + 2H_2$$

or $$4SiHX_3 \rightarrow Si + 2H_2 + 3\ SiX$$

where X is defined as bromine or iodine.

Dilution is required in epitaxial growth processes using chloro-compounds to suppress both homogeneous and heterogeneous nucliation and thus to promote growth from a single nuclius. The large size of the Br and I atoms compared to Cl and H, hinder formation of critical nuclii and thus accomplish the same goal as dilution. As a result, lower dilutions can be utilized with the process of the present invention, and thus lower temperatures.

In addition, the Si-Br and Si-I bond energies are lower than the Si-Cl bond energy, with the result that $\Delta G(T) < 0$ at a lower temperature for the above reactions when X=Br or I compared to X=Cl. This again allows a lower deposition temperature.

Epitaxial film quality is degraded by the presence of interstitial or substitutional impurities or point, line, or volume defects in the crystal lattice known as vacancies, dislocations, or voids. Resistivity, the reciprocal or conductivity, is one measure of film quality since the presence of impurities or crystalline defects decreases resistivity.

Ultrahigh purity single crystal semiconductor grade silicon grown by the Czrochalski technique conventionally has an undoped resistivity of 25 to 75 ohm-cm. Epitaxial silicon grown from the same conventional source material, e.g., SiHCl3, will show an undoped resistivity of 100 to 250 ohm-cm for high quality source materials, and a clean and leak free reactor. In special cases 1000 ohm-cm can be produced. This is due to:

(1) the absence of impurities leached from the crucible by the melt;

(2) slower growth rates which hold defect densities essentially to equilibrium values;

(3) additional purification during growth by surface reevaporation of impurities prior to inclusion in the growing phase.

The process of the present invention, on the other hand, routinely produces resistivities greater than 10,000 and typically 20,000 to 25,000 ohm-cm.

This quality improvement of the invention stems from a combination of two heretofore unrecognized characteristics of the subject source materials when employed in this application;

(a) improved vapor-liquid partition coefficients compared to chlorosilanes;

(b) higher vapor pressures (lower boiling points) of surface active and multi-energy level impurity metal halides.

The individual vapor-liquid partition coefficients have not been quantified; however, it is possible to obtain overall higher purity source material, with an identical number of distillation plates when bromo- and iodosilanes are utilized instead of the presently employed chlorosilanes. Thus, the source materials utilized in the practice of the present invention will be generally of higher purity than those of commercial processes.

In addition, however, a further purification takes place in the deposition process itself. Metallic impurities will be present as halides, phosphates, or nitrates. Table III presents boiling points of metal halides showing KCl and ZnCl2 to have higher boiling points and therefore lower vapor pressures than KBr and ZnBr2, respectively. Since the net flux of atoms to a surface can be expressed as $$J\text{ net} - J\text{ impingement} - J\text{ evaporation} = \frac{1/3\ P - P_o}{\sqrt{2\pi MkT}}$$

and $p(Br) < p(Cl)$ due to higher purity source material, with $p_o(Br) > p_o(Cl)$ due to the lower boiling point of the bromides and iodides compared to chlorides, the net flux to a surface of metallic impurities will be reduced in the bromo- and iodosilane systems. As a result, fewer impurities will be included in the growing epitaxial film, and high quality will be achieved.

TABLE III

| Boiling Points of Chloro- and Bromohalides | | | | |
|---|---|---|---|---|
| Metal Impurity | Chloro-halide | B.P. °C. | Bromo-halide | B.P. °C. |
| Aluminum 220 ppb | AlCl3 | 1827 | AlBr3 | 268 |
| Calcium <30 ppb | CaCl2 | <1600 | CaBr2 | 810 |
| Chromium 6 ppb | CrCl2 | M.P. 824 | CrBr2 | M.P. 842 |
|  | CrCl3 | Subl 1300 | CrBr3 | Subl |
| Copper 13 ppb | CuCl2 | M.P. 498 993d to CuCl | CuBr2 | M.P. 498 |
|  | Cu2Cl2 | 1366 | Cu2Br2 | 1345 |
| Gold <5 ppb | AuCl | 170.0 | AuBr | d 115 |
| Iron 60 ppb | FeCl3 | 315.0 | FeBr3 | subl d. |
|  | FeCl2 | M.P. 670 subl | FeBr2 | d 684 |
| Lithium <20 ppb | LiCl | 1360 | LiBr | 1265 |
| Magnesium 13 ppb | MgCl2 | 1412 | MgBr2 | M.P. 700 |
| Mercury <3 ppb | HgCl2 | 304 | HgBr2 | 322 |
|  | HgCl | 384 | HgBr | Sub 345 |
| Nickel 4 ppb | NiCl2 | d | NiBr2 | d |
| Potassium 40 ppb | KCl | 1500 | KBr | 1380 |
| Silicon <20 ppb | SiCl4 | 57.6 | SiBr4 | 154.0 |
| Titanium <20 ppb | TiCl2 | — | TiBr2 | M.P. 2900 |
|  | TiCl3 | d 440 | TiBr3 | d 400 |
|  | TiCl4 | 136.4 | TiBr4 | 230 |
| Zinc <10 ppb | ZnCl2 | 732 | ZnBr2 | 650.0 |
| Arsenic | AsCl3 | 130 | AsBr3 | 221 |
| Sodium <50 ppb | NaCl | 1413 | NaBr | 1390 |

Thus, this invention is characterized as follows:

(1) This invention is an improved epitaxial silicon growth process that operates at lower temperatures and produces higher quality films than conventional commercial processes at economically useful production rates, through use of bromo- and iodosilanes rather than chlorosilanes or silane. Temperature range 800° C. to 1200° C.

(2) The process of this invention can be operated with or without a diluent such as H2 or He but in all cases less diluent is used than with chlorosilanes or silane under identical conditions of temperature and growth rate; e.g., with dilutions of 1 to 100:1, and pressures from vacuum to atmospheric pressure.

(3) Higher quality films, one measure of which is resistivity, are produced. Up to two orders of magnitude greater resistivity is obtained. Resistivity ranges up to 25,000 ohm-cm, or greater.

As one example of this invention, starting from $HSiBr_3$, epitaxial films of 20,000 to 25,000 ohm-cm are obtained at 1050° C., in 100:1 $H_2$ $HSiBr_3$ at 200–500 Angstroms/minute growth rate. Temperatures as low as 800° C. can be employed by reducing or eliminating the use of a diluent.

INDUSTRIAL APPLICATION

This invention is useful in the semiconductor industry to produce semiconductor devices.

What is claimed is:

1. Homoepitaxial silicon film having an undoped resistivity of 20,000 ohm-cm or greater.

2. A process for manufacturing homoepitaxial silicon film having a high undoped resistivity of at least 10,000 ohm-cm comprising the steps of:
   (a) thermally decomposing tribromosilane or triiodosilane at a temperature of from about 800° C. to about 1,200° C., and
   (b) collecting silicon atoms at a growth rate of from 200 to 500 Angstroms/minute from the decomposition produce of step (a) as a film of homoepitaxial silicon having a resistivity of at least 10,000 ohm-cm.

3. The process of claim 2 wherein the tribromosilane or triiodosilane is diluted with $H_2$ or He, or subatmospheric pressure utilized.

4. The process of claim 2 or claim 3 wherein the tribromosilane is thermally decomposed.

* * * * *